United States Patent
De Pasquale et al.

(10) Patent No.: US 8,326,237 B2
(45) Date of Patent: Dec. 4, 2012

(54) TRANSMITTING A RADIO SIGNAL IN A MOBILE COMMUNICATION NETWORK

(75) Inventors: Andrea De Pasquale, Madrid (ES); Kyriakos Exadaktylos, Madrid (ES); Esperanza Alcazar Viguera, Madrid (ES); Maria Diaz Mateos, Madrid (ES); Beatriz Garriga Muñiz, Madrid (ES); Francisco Javier Dominguez Romero, Madrid (ES); Brendan McWilliams, Madrid (ES); Julio Urbano Ruiz, Madrid (ES); Clara Serrano Solsona, Madrid (ES); Javier López Roman, Madrid (ES); Aitor Garcia Viñas, Madrid (ES); Santiago Tenorio Sanz, Madrid (ES); Yannick Le Pezennec, Madrid (ES)

(73) Assignee: Vodafone Group PLC, Newbury, Berkshire (GB)

( * ) Notice: Subject to any disclaimer, the term of this patent is extended or adjusted under 35 U.S.C. 154(b) by 35 days.

(21) Appl. No.: 12/844,272

(22) Filed: Jul. 27, 2010

(65) Prior Publication Data

US 2011/0070847 A1    Mar. 24, 2011

(30) Foreign Application Priority Data

Jul. 27, 2009   (ES) .................................. 200930517

(51) Int. Cl.
*H04B 7/02*   (2006.01)
*H04B 1/04*   (2006.01)
(52) U.S. Cl. ...................................... 455/101; 455/103
(58) Field of Classification Search .................. 455/101, 455/103, 272; 375/299
See application file for complete search history.

(56) References Cited

U.S. PATENT DOCUMENTS

| 7,113,748 B2 * | 9/2006 | Shapira et al. ............... 455/63.4 |
| 2003/0179137 A1 * | 9/2003 | White et al. .................. 342/361 |
| 2009/0274072 A1 * | 11/2009 | Knox ........................... 370/278 |

FOREIGN PATENT DOCUMENTS

WO    WO 00/49677    8/2000

\* cited by examiner

*Primary Examiner* — Nguyen Vo
(74) *Attorney, Agent, or Firm* — B. Aaron Schulman, Esq.; Nicholas B. Trenkle, Esq.; Stites & Harbison PLLC

(57) ABSTRACT

System and method for transmitting a radio signal in a mobile communication network. The radio signal has a circular polarisation.

9 Claims, 3 Drawing Sheets

TRANSMITTING A RADIO SIGNAL IN A MOBILE COMMUNICATION NETWORK

BACKGROUND OF THE INVENTION

1. Technical Field

The present invention relates to a system for transmission of a radio signal in a mobile communication network as well as to a corresponding method.

2. Description of Related Art

In traditional mobile communication networks a carrier signal being generated at base band level in a radio access node is amplified by a power amplifier and radiated over the air with linear polarisation, typically vertical or at +/−45° slant using a single Tx port.

The polarisation properties of the signal transmitted in the radio channel are modified by reflections from and refraction on multiples obstacles before arriving at the receiver of the mobile terminal, causing the power originally transmitted with a given linear polarisation to be progressively rotated and also to progressively decouple into the orthogonal polarisation (e.g. in to the horizontal if the transmitted wave was at vertical polarisation)

Most mobile terminals comprise a single antenna optimised for receiving a linearly polarized radio signal. In case of little decoupling and the antenna of the mobile terminal being aligned with the received polarization, the quality of the received signal is generally good. However, in case of misalignment at the mobile terminal and/or a strong decoupling between polarisations of the transmitted wave received by the mobile (as an outcome of the propagation of the radio mobile channel) and the polarisation of the mobile antenna system, the quality of the received signal may deteriorate significantly.

In order to improve the quality of the received signal, mobile terminals with receive diversity have been developed. Such mobile terminals comprise a cross polar antenna, for example consisting of two perpendicular dipole antennas, for receiving the radio signal through two independent channels with orthogonal linear polarisations. The signals of both reception branches are combined in the diversity receiver. Although the received signal quality of such mobile terminals is superior to that of the mobile terminals without diversity reception, the performance of Rx diversity implemented in such a way is not optimal under all circumstances. With such an approach the contributions from the two antennas of the mobile station is overall fairly unequal. Indeed the decoupling of the polarisation of the radio channel is often not strong enough to maximise the overall power received at both reception branches and therefore diversity is usually under-performing on average (long term fading), because the majority of the received signal is captured mainly through one of the reception branches in the antenna mobile station.

This effect is predominant under good and medium radio conditions, where multipath has not had a relevant effect on the decoupling between polarisations, yet. This results in the linear polarisation transmitted by the radio base to be still mostly present at the mobile terminal receiver, thus preventing any diversity gain to be achieved at all.

SUMMARY OF THE INVENTION

It is an object of the invention to provide a method and a corresponding cellular communication network by which the above mentioned problems are at least partially solved.

Thereto, according to the invention a system and method according to the independent claims are provided. Favourable embodiments are defined in the dependent claims.

According to an aspect of the invention, a system for use in a mobile communication network is provided comprising transmission means for transmitting a radio signal to one or several mobile terminals with circular polarisation.

As a result thereof, the signal reception quality of mobile terminals not employing diversity reception is improved with the circular polarisation achieved because of decreased sensitivity to cross-polarization fading. Indeed the received signal quality varies much less as now misalignment between the mobile terminal antenna and the received polarisation is prevented. As a result, there are fewer occasions in which the received signal quality is bad than with a linearly polarised radio signal transmitted by the radio access node.

Furthermore, the antenna of a mobile terminal with diversity reception in good radio conditions now receives a similar energy level in both antenna elements resulting in optimum diversity performance. It can be theoretically demonstrated that the signal level received in both branches is not dependent on the incident angle between the propagation direction of the radio signal and the plane of the orthogonal antenna elements.

As a result, the received signal fading in both mobile terminals without diversity reception and mobile terminals with diversity reception is reduced.

The diversity gain obtained with the present invention has a significant effect in mobile communication networks using "aggressive" signal modulation, such as 16QAM used in High-Speed Packet Access (HSPA) or 64QAM used in HSPA+. For example, in UMTS the HSPA throughput is tightly linked to the radio signal quality level. As a result of the reduction of the fading achieved with the present invention, the throughput of HSPA is enhanced, significantly.

Preferably, the transmission means comprise a dual polarised antenna arrangement with a first antenna element and a second antenna element radiating with mutually orthogonal linear polarisations and respectively fed with a first version and a second version of the radio signal with equal power and in quadrature phase.

There are several possible embodiments for obtaining the first version and the second version of the radio signal with equal power and in quadrature phase.

According to a first embodiment, a power divider and phase shift means, inserted between the power amplifier of the transmission means and the dual polarised antenna arrangement is used for this purpose.

Preferably, the power divider and phase shift means comprises a hybrid combiner for generating the first and second version of the radio signal. This hybrid combiner may additionally by configured for enabling diversity reception of radio signals received by the first antenna element and second antenna element, respectively.

The 90° phase difference between the first and second version of the radio signal may be obtained by means of a 90° hybrid combiner. In this case, the feeders between the 90° hybrid combiner and the antenna ports should have the same length within a certain margin.

Alternatively, the hybrid combiner provides output signals with a phase shift other than 90° and the remaining phase shift for obtaining the 90° phase shift between the first and second version of the radio signal is obtained by means of a phase shifter and/or length difference between the feeders between the hybrid combiner and the dual polarised antenna arrangement.

According to a second embodiment, the split of the signal into two branches containing the same information and with equal power and 90° phase difference is performed at base band level. The external power divider and phase shift means of the first embodiment may be omitted in this case. The additional power amplifier, which is needed for amplifying the second branch of the signal, may be additionally used for capacity improvement or for introducing other features requiring two power amplifiers.

The 90° phase shift between the first and second version of the base band signal may be obtained by means of a 90° phase shifter inserted in the processing signal board. In this case, the feeders between the two power amplifiers and the antenna ports should have the same length within a certain margin and in addition both power amplifiers should be synchronized in phase.

Alternatively, the 90° phase shift between the first and second version of the base band signal may be obtained by means of a variable phase shifter. A phase shift detector detects the phase shift between the first version and the second version of the radio signal and provides the variable phase shifter with phase correction information, i.e. the deviation of the detected phase shift from 90°. The variable phase shifter is configured to adapt the phase shift between the first and second version of the base band signal in accordance with the phase correction information. In this way, any inaccuracies in phase difference between the first and second version of the radio signal are continuously corrected.

According to a third embodiment, the power divider and phase shift means is integrated in the antenna arrangement. In this case the potential problems that might occur due to differences in feeder lengths are avoided.

According to a further aspect of the invention, a method for use in a mobile communication network is provided for transmitting a radio signal to one or several mobile terminals characterised in that the radio signal is transmitted with circular polarisation.

These and other aspects of the invention will be apparent from and elucidated with reference to the embodiments described hereinafter.

BRIEF DESCRIPTION OF THE DRAWINGS

The invention will be better understood and its numerous objects and advantages will become more apparent to those skilled in the art by reference to the following drawings, in conjunction with the accompanying specification, in which.

Throughout the figures like reference numerals refer to like elements.

DETAILED DESCRIPTION OF THE PRESENT INVENTION

Figure 1:
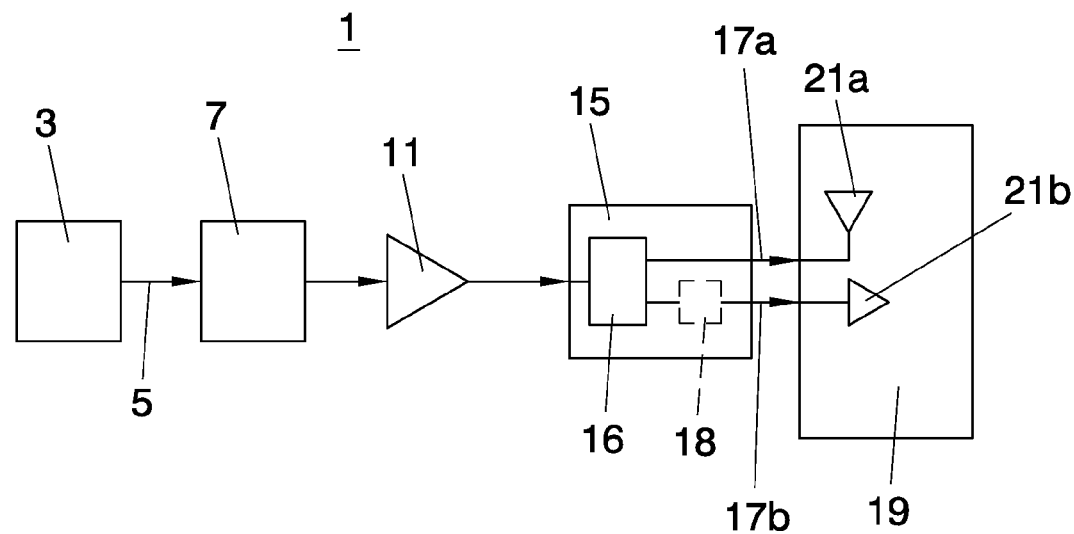
FIG. 1 shows a system according to a first embodiment of the present invention.
Figure 2:
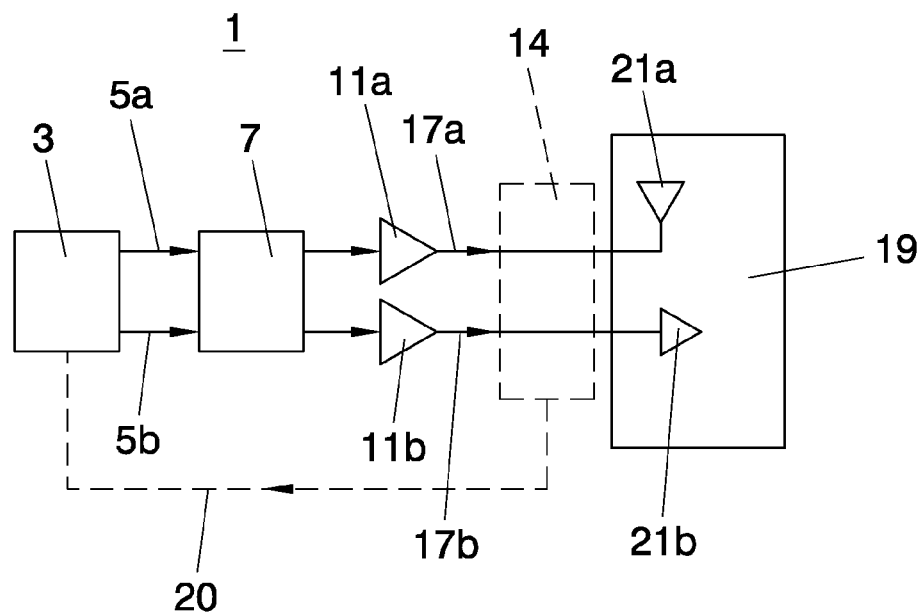
FIG. 2 shows a system according to a second embodiment of the present invention.

According to the invention, a system for use in mobile communication networks comprises transmission means for transmitting a radio signal with circular polarisation to one or several mobile terminals.

FIGS. 1-4 show three different preferred embodiments of the system of the invention. In the first two embodiments, circular polarisation is obtained by means of a cross polar antenna arrangement 19, i.e. a dual polarized antenna arrangement radiating two signals at the same frequency with mutually orthogonal polarisations, which is fed simultaneously with a first version of the radio signal 17a and a second version of the radio signal 17b. The first and the second version of the radio signal comprise the same information, have equal power and have a 90 degree phase difference.

According to the first embodiment, the transmission means 1 comprise base band processing means 3 providing a base band signal 5. The base band signal 5 is up-converted to a radio frequency by frequency conversion means 7 and amplified by power amplifier 11, thereby obtaining radio signal 13. Radio signal 13 is split by power divider and phase shifting means 15 into the first version of the radio signal 17a and the second version of the radio signal 17b. The power divider and phase shifting means 15 may consist of any passive or active component or combinations of passive or active components that splits an input signal equally between both outputs but with a phase shift of 90 degrees between both output branches. However, the power divider and phase shift means preferably comprises a 90° hybrid combiner 16. This commercially available component comprises two inputs and two outputs and splits the input signal at each input between both outputs with a phase shift of 90 degrees between the output branches. This component additionally may be used for diversity reception of radio signals received by the first antenna element and second antenna element, respectively.

The first and second versions of the radio signal are fed to the cross polar antenna arrangement 19. As a result, the same signal is available at both input ports of the antenna arrangement 19 but with 90° phase difference. The feeder lengths between the 90° hybrid combiner 16 and the antenna input ports have to be the same for both legs within a certain margin. The cross polar antenna arrangement 19 comprises a first antenna element 21a for radiating a signal with a first linear polarisation and a second antenna element 21b for radiating a signal with a second linear polarisation, which is orthogonal to the first polarisation.

Alternatively, a hybrid combiner providing output signals with a phase shift other than 90° may be used or providing output signals with no phase shift at all. In this case the remaining phase shift for obtaining the 90° phase shift between the first and second version of the radio signal should be obtained by means of a generic phase shifter 18 and/or length difference between the feeders between the hybrid combiner and the dual polarised antenna arrangement.

According to the second embodiment, the signal is already split at base band level by the base band processing means 3, into a first version of the base band signal 5a and a second version of the base band signal 5b. The first version of the base band signal 5a and the second version of the base band signal component 5b contain the same information, have 90° phase difference between them and have equal power. This is shown in more detail in FIG. 3. The base band processing means 3 comprises a base band signal divider 2 for dividing the input signal and a 90° phase shifter 4 for generating the required 90° phase difference. Alternatively, the phase shifter 4 is a variable phase shifter. In this case, a phase shift detector 14 is needed that detects the phase shift between the first version and the second version of the radio signal and provides the variable phase shifter with phase correction information 20, i.e. the deviation of the detected phase shift from 90°. The variable phase shifter is configured to adapt the phase shift between the first and second version of the base band signal in accordance with the phase correction information.

The frequency conversion means 7, the first power amplifier 11a and the second power amplifier 11b up-convert and amplify the first version of the base band signal 5a and the second version of the base band signal 5b, obtaining thereby the first version of the radio signal 17a and the second version of the radio signal 17b, respectively.

The power amplifiers 11a,11b required for both legs should be in phase and the length of the feeders to the two antenna input ports should again be the same within a certain margin. With this second embodiment, the same effect as with the first embodiment is obtained without adding any additional elements but one additional power amplifier 11b. Apart from amplifying the second version of the radio signal, the second power amplifier 11b may be additionally used for capacity improvement or for introducing other features requiring two power amplifiers.

Figure 3:
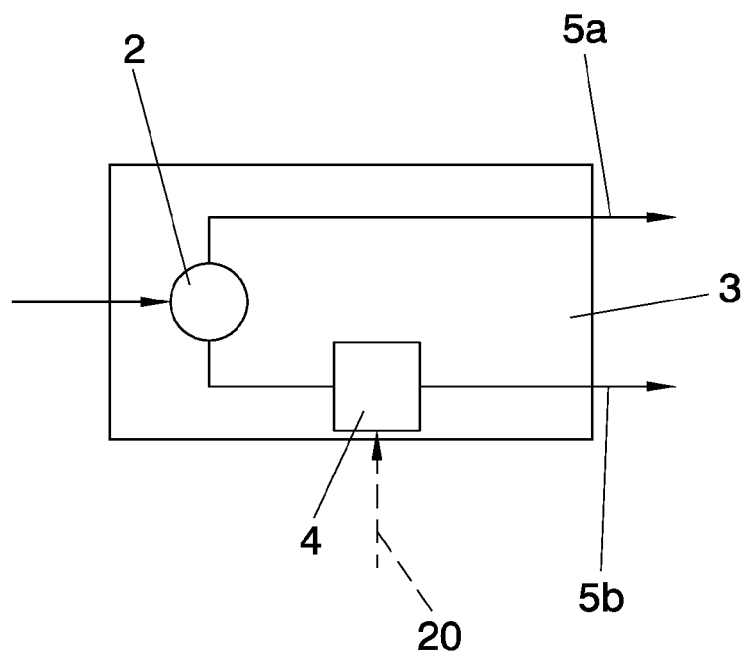
FIG. 3 shows a component of the system according to FIG. 2 in detail.
Figure 4:
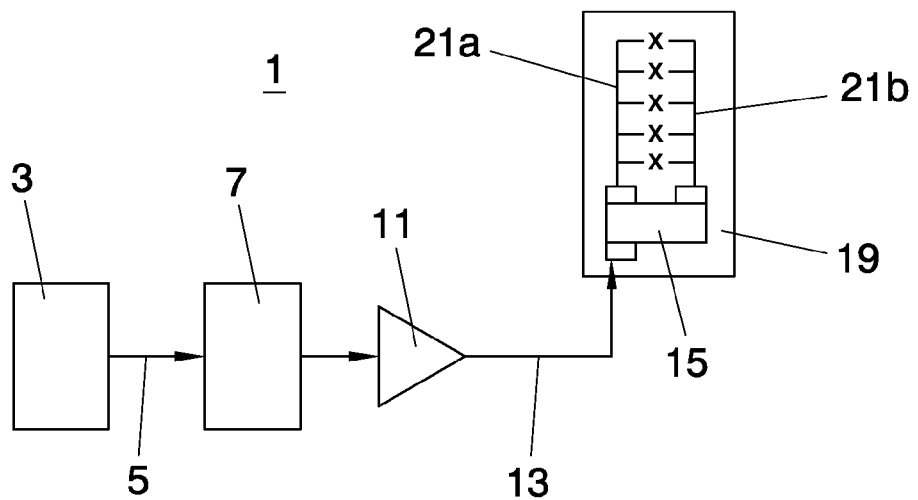
FIG. 4 shows a system according to a third embodiment of the present invention.

According to a third embodiment shown in FIG. 3, the power divider and phase shift means 15 is inserted in the body of an existing cross polar antenna arrangement 19, wherein the first antenna element 21a and the second antenna element 21b are antenna arrays. In this case, there are no constraints regarding the feeder length between the power divider and phase shift means outputs and the antenna ports inputs because the power divider and phase shift means outputs are directly connected to the antenna elements feeder network.

The use of the system according to the present invention has proven to be very advantageous for High Speed Downlink Packet Access (HSDPA) bearers. The improvement in the received signal quality of the HSDPA bearer at a HSPA mobile terminal results in a better channel estimation. So, Block Error Rate (BLER) values are lower and the average value of the Channel Quality Indicator (CQI) reported by the mobile terminal increases.

Figure 5:
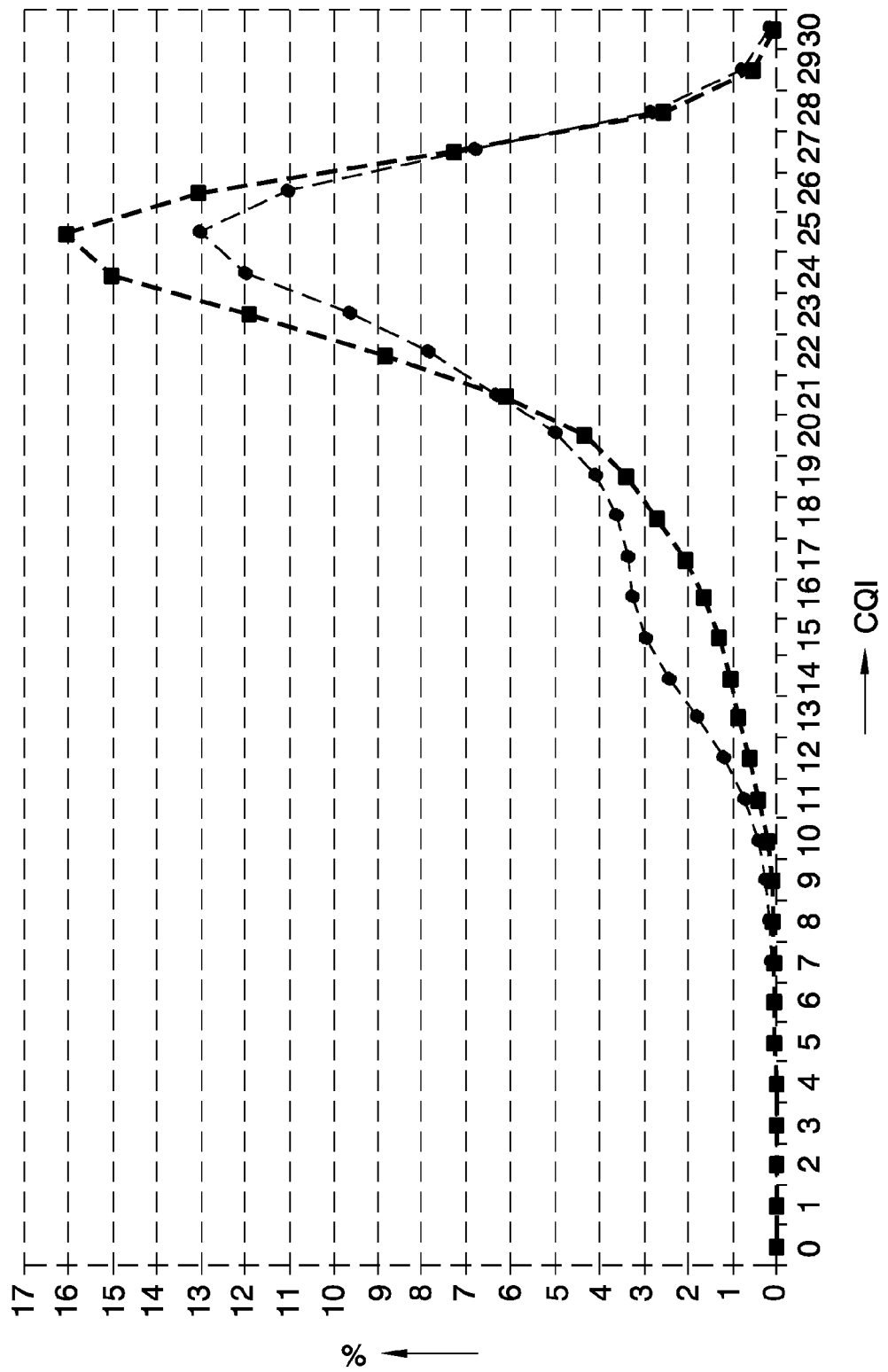
FIG. 5 illustrates the effect of the system according to the present invention on reported channel quality indicator values for high-speed packet access.

This is illustrated in FIG. 5, which shows the distribution of CQI values reported back by mobile terminals for signal transmission with linear polarisation (dotted line) and for signal transmission with circular polarisation (continuous line).

According to the adaptive modulation and coding scheme used for HSDPA, the mobile communication network in this case significantly increases the data throughput by changing the used modulation and/or using additional codes.

However, the system according to the present invention may also advantageously be used with any other data or voice signals.

It should be noted that the terms circular polarisation, equal power level and 90° phase difference used in this detailed description and the claims are intended to include slight deviations thereof, that may take the form of any elliptical polarization that intends to achieve same benefits based on same principles stated here.

The system according to the present invention may be implemented in any type of radio access nodes used in mobile communication networks, such as Base Radio Transceiver Stations (BTS), Node B's or in Evolved Nodes-B (eNB) in a Long Term Evolution (LTE) cellular communication network, currently being standardised and also often referred to as the fourth generation (4G) cellular network. It may also be implemented in the Remote Radio Unit in the distributed Node B concept.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. System for use in a mobile communication network, the system comprising:
   transmission means for transmitting a radio signal to one or several mobile terminals, the transmission means comprising a power amplifier and power divider and phase shift means,
   wherein the transmission means are configured for transmitting the radio signal with circular polarisation,
   wherein the transmission means comprise a dual polarised antenna arrangement with a first antenna element and second antenna element radiating with mutually orthogonal linear polarisations and respectively fed with a first version and a second version of the radio signal with equal power and in quadrature phase, and
   wherein the power divider and phase shift means is inserted between the power amplifier and the dual polarized antenna arrangement and generates the first and second versions of the radio signal.

2. System according to claim 1, wherein the power divider and phase shift means comprises a hybrid combiner for generating the first and second version of the radio signal, which is additionally configured for enabling diversity reception of radio signals received by the first antenna element and second antenna element, respectively.

3. System according to claim 2, wherein the hybrid combiner is a 90° hybrid combiner and the feeders between the dual polarised antenna arrangement and the 90° hybrid combiner have the same length.

4. System according to claim 2, wherein the hybrid combiner provides output signals with a phase shift other than 90° and wherein the remaining phase shift for obtaining the 90° phase shift between the first and second version of the radio signal is obtained by means of a phase shifter and/or length difference between the feeders between the hybrid combiner and the dual polarised antenna arrangement.

5. System according to claim 1, wherein the power divider and phase shift means is integrated in the antenna arrangement.

6. System for use in a mobile communication network, the system comprising:
   transmission means for transmitting a radio signal with circular polarisation to one or several mobile terminals, wherein the transmission means comprise base band processing means for dividing a base band signal into a first version and a second version with equal power and in quadrature phase, frequency conversion means for converting the first version and the second version of the base band signal into a first version and a second version of the radio signal to be transmitted, and a first power amplifier and a second power amplifier for amplifying the first version of the radio signal and the second radio version of the radio signal, respectively, and wherein the transmission means comprise a dual polarised antenna arrangement with a first antenna element and second antenna element radiating with mutually orthogonal linear polarisations and respectively fed with the first version and the second version of the radio signal with equal power and in quadrature phase.

7. System according to claim 6, wherein the base band processing means comprises a 90° phase shifter for obtaining the 90° phase shift between the first and second version of the base band signal.

8. System according to claim 6, wherein the base band processing means comprises a variable phase shifter and the transmission means comprises a phase shift detector for detecting the phase shift between the first version and the second version of the radio signal and providing the variable phase shifter with phase correction information, the variable phase shifter being configured to adapt the phase shift between the first and second version of the base band signal in accordance with the phase correction information.

9. Method for use in a mobile communication network for transmitting a radio signal to one or several mobile terminals, wherein the radio signal is transmitted with circular polarisation, the method comprising:

dividing a base band signal into a first version and a second version with equal power and in quadrature phase;

converting the first version and the second version of the base band signal into a first version and a second version of the radio signal to be transmitted;

respectively amplifying the first version of the radio signal and the second radio version of the radio signal; and respectively feeding the first version and the second version of the radio signal with equal power and in quadrature phase to a first antenna element and second antenna element radiating with mutually orthogonal linear polarisations in a dual polarised antenna arrangement.

* * * * *